(12) United States Patent
Puggl

(10) Patent No.: US 8,997,764 B2
(45) Date of Patent: Apr. 7, 2015

(54) METHOD AND APPARATUS FOR LIQUID TREATMENT OF WAFER SHAPED ARTICLES

(75) Inventor: Michael Puggl, Sankt Stefan (AT)

(73) Assignee: Lam Research AG, Villach (AT)

( * ) Notice: Subject to any disclaimer, the term of this patent is extended or adjusted under 35 U.S.C. 154(b) by 957 days.

(21) Appl. No.: 13/118,080

(22) Filed: May 27, 2011

(65) Prior Publication Data

US 2012/0298149 A1 Nov. 29, 2012

(51) Int. Cl.
*B08B 3/02* (2006.01)
*H01L 21/67* (2006.01)
*H01L 21/687* (2006.01)

(52) U.S. Cl.
CPC .... *H01L 21/67034* (2013.01); *H01L 21/67051* (2013.01); *H01L 21/68728* (2013.01)

(58) Field of Classification Search
USPC ............. 134/153, 151, 157, 95.3, 103.3, 99.1
See application file for complete search history.

(56) References Cited

U.S. PATENT DOCUMENTS

| | | | |
|---|---|---|---|
| 4,903,717 A | 2/1990 | Sumnitsch | |
| 5,882,433 A | 3/1999 | Ueno | |
| 5,927,305 A * | 7/1999 | Shiba | 134/153 |
| 6,536,454 B2 | 3/2003 | Lindner | |
| 7,837,803 B2 | 11/2010 | Hohenwarter | |
| 7,891,314 B2 | 2/2011 | Pichler | |
| 2001/0037858 A1 | 11/2001 | Taniyama et al. | |
| 2002/0096196 A1 | 7/2002 | Toshima et al. | |
| 2004/0055707 A1 * | 3/2004 | Sato et al. | 156/345.11 |
| 2005/0072525 A1 | 4/2005 | Pancham et al. | |
| 2010/0200163 A1 | 8/2010 | Puggl | |
| 2010/0200547 A1 | 8/2010 | Higashijima et al. | |

FOREIGN PATENT DOCUMENTS

| | | | |
|---|---|---|---|
| WO | 2004/084278 | | 9/2004 |
| WO | 2006/008236 | | 1/2006 |
| WO | 2009/010394 | | 1/2009 |
| WO | WO 2009/010394 | * | 1/2009 |
| WO | 2011/007287 | | 1/2011 |

OTHER PUBLICATIONS

U.S. Appl. No. 12/914,802, filed Oct. 28, 2010.
U.S. Appl. No. 12/668,940, filed Jan. 13, 2010.
U.S. Appl. No. 12/642,117, filed Dec. 18, 2009.
International Search Report, dated Oct. 2, 2012, from corresponding PCT application.

* cited by examiner

*Primary Examiner* — Saeed T Chaudhry
(74) *Attorney, Agent, or Firm* — Young & Thompson

(57) ABSTRACT

An apparatus for treating a wafer-shaped article, comprises a spin chuck for holding a wafer-shaped article in a predetermined orientation, at least one upper nozzle for dispensing a treatment fluid onto an upwardly facing surface of a wafer-shaped article when positioned on the spin chuck, and at least one lower nozzle arm comprising a series of lower nozzles extending from a central region of the spin chuck to a peripheral region of the spin chuck. The series of nozzles comprises a smaller nozzle in a central region of the spin chuck and a larger nozzle in a peripheral region of the spin chuck. In the method according to the invention, a heated liquid is supplied through the series of nozzles so as to supply more heat to peripheral regions of a wafer than to central regions.

15 Claims, 2 Drawing Sheets

METHOD AND APPARATUS FOR LIQUID TREATMENT OF WAFER SHAPED ARTICLES

BACKGROUND OF THE INVENTION

1. Field of the Invention

The invention relates to a method and apparatus for liquid treatment of wafer-shaped articles.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

Techniques for drying a surface of a disc-shaped article are typically used in the semiconductor industry after cleaning a silicon wafer during production processes (e.g. pre-photo clean, post CMP-cleaning, and post plasma cleaning). However, such drying methods may be applied for other plate-like articles such as compact discs, photo masks, reticles, magnetic discs or flat panel displays. When used in semiconductor industry it may also be applied for glass substrates (e.g. in silicon-on-insulator processes), III-V substrates (e.g. GaAs) or any other substrate or carrier used for producing integrated circuits.

Various drying methods are known in the semiconductor industry, some of which utilize isopropyl alcohol to reduce surface tension of rinse water on a semiconductor wafer surface. See, e.g., U.S. Pat. No. 5,882,433. Improvements upon such methods, involving the use of heated isopropyl alcohol, are described in commonly-owned patent applications WO 2011/007287 and U.S. Ser. No. 12/914,802 (filed Oct. 28, 2010).

There remains a need, however, to develop improved methods for preventing pattern collapse in the submicroscopic structures formed on such semiconductor wafers, not only during such drying process but also during other liquid treatments. Pattern collapse can occur when the surface tension of a liquid moving radially outwardly across the surface of a rotating wafer applies a damaging or destructive force to the submicroscopic structures formed on the wafer surface.

The problem of pattern collapse becomes more serious as the diameter of semiconductor wafers increases. For example, the current generation of single wafer wet processing technology is designed for 300 mm diameter wafers, but the previous generation technology was designed for 200 mm wafers and a next generation may be designed for wafers of 450 mm or larger diameter.

The problem of pattern collapse also becomes more serious as the aspect ratio of the submicroscopic structures continues to increase. This is also an ongoing trend in the manufacture of semiconductor devices, as the pressure to reduce device dimensions in general applies more to the horizontal layout and less to the thickness direction.

SUMMARY OF THE INVENTION

The present invention was based in part on the recognition that techniques as described in WO 2011/007287 and U.S. Ser. No. 12/914,802 might not be fully effective in preventing pattern collapse to the extent that heated liquid dispensed in a central region of the upper side of a wafer-shaped article is cooled substantially as it travels radially outwardly toward the periphery of the wafer-shaped article, owing to the higher linear velocity of the rotating wafer surface at the periphery relative to the center.

Thus, during a drying process utilizing heated media dispensed onto the topside of the rotating substrate, the medium utilized does not cool down uniformly. From the center to the edge the cooling down process will increase significantly because of the increasing circumferential speed. This can lead to structure pattern collapse because of the higher surface tension of the cooler medium.

That recognition has led to the present invention, which, in one aspect, relates to an apparatus for treating a wafer-shaped article, comprising a spin chuck for holding a wafer-shaped article in a predetermined orientation wherein a lower surface of the wafer-shaped article is spaced a predetermined distance from an upper surface of the spin chuck. The apparatus moreover comprises at least one upper nozzle for dispensing a treatment fluid onto an upwardly facing surface of a wafer-shaped article when positioned on the spin chuck, and at least one lower nozzle arm comprising a series of lower nozzles extending from a central region of the spin chuck to a peripheral region of the spin chuck, the series of nozzles being directed upwardly toward the lower surface of a wafer-shaped article when positioned on the spin chuck. The series of nozzles comprises a smaller nozzle in a central region of the spin chuck and a larger nozzle in a peripheral region of the spin chuck, and the at least one lower nozzle arm is mounted to the spin chuck so as to remain stationary during rotation of the spin chuck and so as to be non-displaceable axially of the spin chuck.

In preferred embodiments of the apparatus according to the invention, the spin chuck further comprises a peripheral series of upwardly projecting gripping elements positioned so as to be engageable with a peripheral edge of a wafer-shaped article to be held by the spin chuck, each of the upwardly projecting gripping elements being pivotable about an axis parallel to an axis of rotation of the spin chuck.

In preferred embodiments of the apparatus according to the invention, each of the upwardly projecting gripping elements comprises an eccentric pin that is moveable upon pivoting of the gripping element from a radially inward position engaging a wafer-shaped article to a radially outward position releasing a wafer-shaped article.

In preferred embodiments of the apparatus according to the invention, the apparatus is a process module for single wafer wet processing of semiconductor wafers.

In preferred embodiments of the apparatus according to the invention, the at least one lower nozzle arm is a single nozzle arm.

In preferred embodiments of the apparatus according to the invention, the at least one lower nozzle arm comprises a radially innermost lower nozzle that is positioned radially outward of a rotation axis of the spin chuck by a distance of 5 to 25 mm, preferably 7 to 15 mm, and more preferably about 10 mm.

In preferred embodiments of the apparatus according to the invention, the at least one lower nozzle arm extends over an upper rotating surface of said spin chuck and is spaced from said upper rotating surface by a fixed distance of 0.5 to 3 mm, preferably 0.7 to 2 mm, and more preferably about 2 mm.

In preferred embodiments of the apparatus according to the invention, the series of nozzles comprises at least four, preferably at least six, more preferably at least eight and most preferably nine nozzles.

In preferred embodiments of the apparatus according to the invention, the spin chuck is adapted to hold a wafer-shaped article such that a downwardly-facing major surface of the wafer-shaped article is spaced from the at least one lower nozzle arm by a distance of 2 to 10 mm, preferably 3 to 7 mm, and more preferably about 5 mm.

Another aspect of the present invention is a process for treating a wafer-shaped article, comprising positioning a wafer-shaped article on a spin chuck in a predetermined orientation wherein a lower surface of the wafer-shaped article is spaced a predetermined distance from an upper surface of the spin chuck. A treatment fluid is dispensed onto an upwardly facing surface of a wafer-shaped article from at least one upper nozzle while rotating the wafer-shaped article in the spin chuck, and a heated liquid is simultaneously dispensed onto a lower surface of the rotating wafer-shaped article. The heated liquid is dispensed through a series of lower nozzles extending from a central region of the spin chuck to a peripheral region of the spin chuck, the series of nozzles comprising a smaller nozzle in a central region of the spin chuck and a larger nozzle in a peripheral region of the spin chuck. The series of nozzles are sized and positioned such that a heated liquid dispensed through the series of nozzles supplies more heat per unit area in peripheral regions of the wafer-shaped article than in central regions of the wafer-shaped article.

In preferred embodiments of the process according to the invention, the series of nozzles are openings formed in a lower nozzle arm that is mounted to the spin chuck so as to remain stationary during rotation of the spin chuck and so as to be non-displaceable axially of the spin chuck.

In preferred embodiments of the process according to the invention, a wafer-shaped article is positioned on the spin chuck by engaging a peripheral edge of the wafer shaped article with each of a series of gripping pins, wherein the gripping pins comprise a body that is pivotable about an axis parallel to an axis of rotation of the spin chuck.

In preferred embodiments of the process according to the invention, the treatment fluid dispensed onto the upwardly facing surface of the wafer-shaped article is a liquid comprising isopropyl alcohol, and the heated liquid dispensed onto the lower surface of the wafer-shaped article is water.

In preferred embodiments of the process according to the invention, the liquid comprising isopropyl alcohol is heated to a temperature in excess of 30° C., and preferably in excess of 60° C.

In preferred embodiments of the process according to the invention, flow rates of the isopropyl alcohol-containing liquid and the water are controlled such that the wafer-shaped article is maintained at substantially the same temperature at a peripheral region as at a central region.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
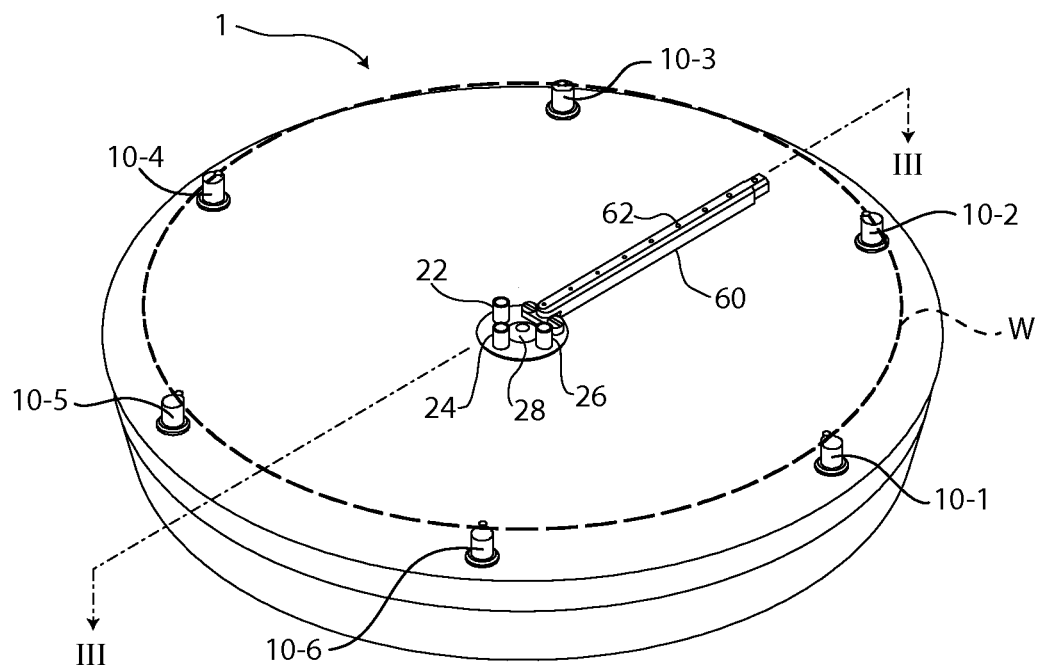
FIG. 1 is a schematic perspective view from above of a chuck according to an embodiment of the invention, with a wafer in position as indicated in broken line.

Referring now to the drawings, FIG. 1 depicts a spin chuck 1 that holds a wafer W thereon in a predetermined orientation, which is preferably such that the major surfaces of disposed horizontally or within ±20° of horizontal. Spin chuck 1 may for example be a chuck that operates according to the Bernoulli principle, as described for example in U.S. Pat. No. 4,903,717.

Chuck 1 includes a series of gripping pins, which in this embodiment are six in number, designated 10-1 through 10-6. Gripping pins 10-1 to 10-6 prevent the wafer from sliding laterally off the chuck. Alternatively, gripping pins 10-1 to 10-6 may also provide subjacent support for wafer W, in which case the chuck need not operate according to the Bernoulli principle and need not be adapted to supply a gas cushion beneath wafer W.

Although not shown in the figures, the spin chuck may be surrounded by a process chamber, which may be a multi-level process chamber as described in commonly-owned U.S. Pat. No. 7,837,803 (corresponding to WO 2004/084278). The spin chuck can be positioned at the selected level by moving the chuck axially relative to the stationary surrounding chamber, or by moving the surrounding chamber axially relative to the axially-stationary chuck, as described in connection with FIG. 4 of U.S. Pat. No. 6,536,454.

Figure 2:
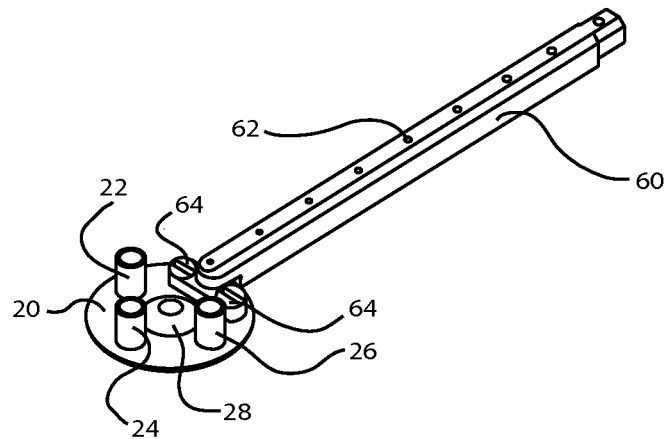
FIG. 2 is an enlarged perspective view of the topside components of the lower nozzle assembly of the embodiment of FIG. 1.

Chuck 1 furthermore comprises a dispensing assembly for supplying fluids to the downwardly-facing side of the wafer W, which is similar in some respects to those described in U.S. Pat. No. 6,536,454 and U.S. Patent Application Publication No. 2010/0200163 (corresponding to WO 2009/010394). That dispensing assembly, as shown in greater detail in FIG. 2, comprises a non-rotating (stationary) nozzle head 20 that penetrates through a center hole of the spin chuck leaving a gap between the spin chuck and the nozzle head of preferably about 0.2 mm. The gap can be purged by gas (e.g. nitrogen) during processing. Five nozzles 22, 24, 26, 28, 60 protrude through the nozzle head. Pipes 22, 24, 26 are each connected to different liquid sources and project preferably 5 mm over the top surface of the spin chuck as well as the nozzle head. The openings (nozzles) of pipes 22, 24, 26 are directed towards the downwardly facing surface of the wafer. Pipe 28 is centrally arranged and is connected to a gas source. Gas such as nitrogen or ultra clean air is lead through pipe 28 towards the downwardly-facing surface of the wafer.

Reference numeral 60 denotes a radial nozzle arm which is open at its radially inner end, where it receives a heated liquid, and closed at its radially outer end. Between those ends are disposed a series of nozzles or openings 62, which in this embodiment are nine in number. It will be noted that each nozzle 62 has a larger diameter than the nozzle that precedes, moving from the central region to the peripheral region of the spin chuck.

In particular, the size and number of nozzles 62 is selected so that a larger quantity of heated liquid is supplied to the underside of wafer W in its peripheral regions than in its central regions.

In a preferred embodiment the nozzles 62 are sized relative to one another as a function of the overlying wafer circumference and hence of the distance of each nozzle from the center of the spin chuck. Thus, for example, an outer nozzle 62 whose center is 14 cm from the center of the spin chuck would have an outlet whose cross-sectional area is approximately 14 times that of an inner nozzle 62 whose center is 1 cm from the center of the spin chuck.

Indeed, it will be noted that the radially innermost nozzle 62 is positioned some distance radially outward of the center of wafer W, as supplemental heating in the centremost region of the wafer may be unnecessary. Radial nozzle arm 60 is rigidly secured to nozzle head 20 e.g. by screws 64. Therefore, if the spin chuck is designed of be axially displaceable, then the nozzle assembly including radial nozzle arm 60 will be axially displaceable along with the spin chuck; however, the nozzle assembly and radial nozzle arm 60 are not axially displaceable relative to the spin chuck.

Nozzles 62 are in this embodiment evenly spaced along arm 60, spaced from one another by approximately 15 mm. However, the spacing between nozzles 62 may vary, and may also be non-uniform. The number and cross-sectional area of nozzles 62 may also be varied.

Figure 3:
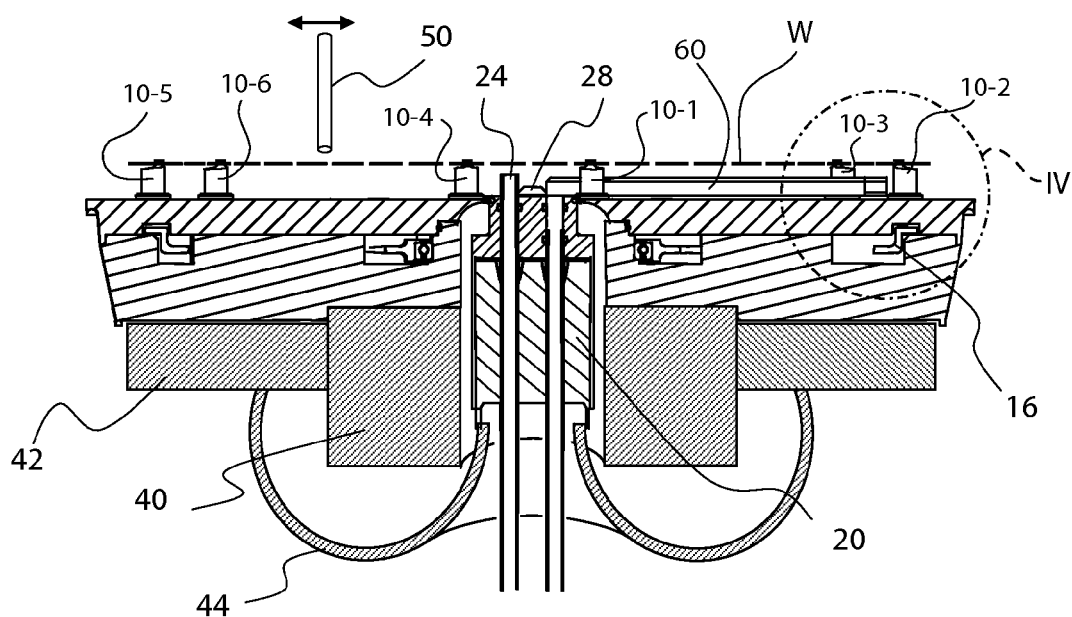
FIG. 3 is a partial axial section through the chuck depicted in FIG. 1, taken along the line III-III of FIG. 1.

Referring now to FIG. 3, it will be seen that radial nozzle arm 60 is mounted in a cantilever fashion such that it is spaced from both the overlying wafer W as well as from the rotating upper surface of chuck 1. Arm 60 is therefore rigid enough that it does not contact either the rotating surfaces of the chuck or the wafer.

Spin chuck 1 is mounted to the rotor of a hollow-shaft motor 40 (schematically shown in FIG. 3), and stationary nozzle head 20 penetrates through a central opening of the spin chuck 1. The stator of the hollow-shaft motor 40 is mounted to the mounting plate 42 (schematically shown in FIG. 3). Nozzle head 20 and mounting plate 42 are mounted to the same stationary frame 44 (schematically shown in FIG. 3).

Gripping elements 10-1 to 10-6 are provided with eccentrically mounted gripping pins. The gripping elements are conjointly rotated about their cylindrical axes by a tooth gear 16 that is in meshing engaging with all of the gripping elements. The eccentric pins are thus moved in concert between a radially inner closed position in which a wafer W is secured, to a radially outer open position in which the wafer W is released. Gripping elements 10-1 to 10-6 can be made as described in commonly-owned U.S. application Ser. No. 12/668,940 (corresponding to WO 2009/010394, or as described in commonly-owned U.S. application Ser. No. 12/642,117, filed Dec. 18, 2009). Gripping elements 10-1 to 10-6 thus comprise an eccentric uppermost portion that contacts wafer W, projecting from a base that is mounted for pivotal movement about its central axis. In particular, a ring gear 16 is centered on the underside of the chuck upper body, and simultaneously engages via its peripheral gear teeth with gear teeth formed on the base of each of the pins 10-1 to 10-6. Pins 10-1 to 10-6 are evenly distributed about the periphery of spin chuck 1, with at least three and preferably six such pins 10 being provided.

An upper liquid dispenser 50 supplies treatment liquid from above, and can incorporate a plurality of different liquid dispensing nozzles for dispensing a variety of different treatment liquids, as described for example in commonly-owned U.S. Pat. No. 7,891,314 (corresponding to WO 2006/008236). Upper liquid dispenser 50 is preferably displaceable radially of the wafer W, to aid in spreading treatment liquid over the entire upwardly facing surface of wafer W as it is rotated on the spin chuck.

Figure 4:
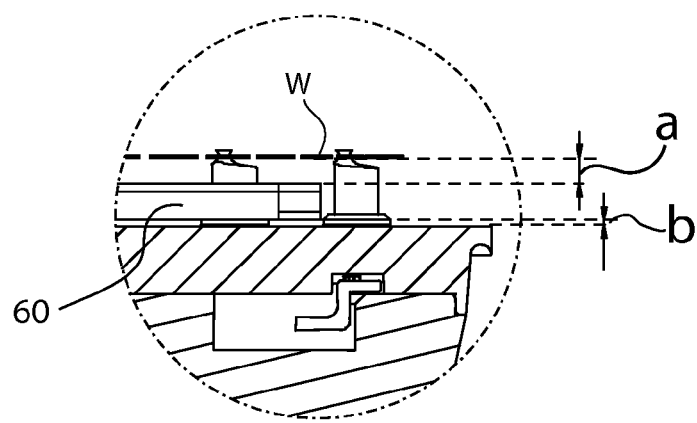
FIG. 4 is an enlarged view of the detail IV designated in FIG. 3.

In the detail of FIG. 4, it can be seen that the wafer W is positioned above the upper surface of the radial nozzle arm 60 by a distance "a" that is 2 to 10 mm, preferably 3 to 7 mm, and more preferably about 5 mm. On the other hand, the lower nozzle arm is spaced from the upper rotating surface of the spin chuck by a fixed distance of 0.5 to 3 mm, preferably 0.7 to 2 mm, and more preferably about 1 mm. As the radial nozzle arm 60 in this embodiment has a thickness of about 7 mm, the distance from the upper rotating surface of the chuck 1 to the underside of wafer W is only about 13 mm.

In the following a process for treating the wafer W shall be described. A wafer W, for example a 300 mm silicon wafer, is placed on the spin chuck 1, and securely held by gripping pins 10-1 to 10-6. The spin chuck is rotated at a spin speed of, for example, 500 rpm. A drying liquid comprising heated isopropyl alcohol is supplied to the center of the wafer upper surface at volume flow of 1500 ml/min through nozzle 50. Simultaneously a second flow of heated deionized water is supplied through the nozzles 62. Thereafter nitrogen is supplied through nozzle 28 at a volume flow of 10 l/min for removing the rinsing liquid while the spin speed is at 1500 rpm. During the whole process nitrogen may be supplied at a volume flow of 0.1 l/min.

Nozzles 62 are sized and positioned such that a heated liquid dispensed through the series of nozzles supplies more heat per unit area in peripheral regions of the wafer W than in central regions of the wafer W.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for treating a wafer-shaped article, comprising:
   a spin chuck for holding a wafer-shaped article in a predetermined orientation wherein a lower surface of the wafer-shaped article is spaced a predetermined distance from an upper surface of the spin chuck;
   at least one upper nozzle for dispensing a treatment fluid onto an upwardly facing surface of a wafer-shaped article when positioned on the spin chuck; and
   at least one lower nozzle arm comprising a series of lower nozzles extending from a central region of the spin chuck to a peripheral region of the spin chuck, the series of nozzles being directed upwardly toward the lower surface of a wafer-shaped article when positioned on the spin chuck, and the series of nozzles comprising a nozzle having a smaller discharge opening in a central region of the spin chuck and a nozzle having a larger discharge opening in a peripheral region of the spin chuck; wherein the at least one lower nozzle arm is mounted to the spin chuck so as to remain stationary during rotation of said spin chuck and so as to be non-displaceable axially of the spin chuck.

2. The apparatus according to claim 1, wherein said spin chuck further comprises a peripheral series of upwardly projecting gripping elements positioned so as to be engageable with a peripheral edge of a wafer-shaped article to be held by the spin chuck, each of the upwardly projecting gripping elements being pivotable about an axis parallel to an axis of rotation of the spin chuck.

3. The apparatus according to claim 2, wherein each of said upwardly projecting gripping elements comprises an eccentric pin that is moveable upon pivoting of the gripping element from a radially inward position engaging a wafer-shaped article to a radially outward position releasing a wafer-shaped article.

4. The apparatus according to claim 1, wherein said apparatus is a process module for single wafer wet processing of semiconductor wafers.

5. The apparatus according to claim 1, wherein said at least one lower nozzle arm is a single nozzle arm.

6. The apparatus according to claim 1, wherein said at least one lower nozzle arm comprises a radially innermost lower nozzle that is positioned radially outward of a rotation axis of said spin chuck by a distance of 5 to 25 mm.

7. The apparatus according to claim 1, wherein said at least one lower nozzle arm extends over an upper rotating surface of said spin chuck and is spaced from said upper rotating surface by a fixed distance of 0.5 to 3 mm.

8. The apparatus according to claim 7, wherein said at least one lower nozzle arm is spaced from said upper rotating surface by a fixed distance of 0.7 to 2 mm.

9. The apparatus according to claim 7, wherein said at least one lower nozzle arm is spaced from said upper rotating surface by a fixed distance of about 1 mm.

10. The apparatus according to claim 1, wherein the series of nozzles comprises at least four nozzles.

11. The apparatus according to claim 10, wherein the series of nozzles comprises at least six nozzles.

12. The apparatus according to claim 10, wherein the series of nozzles comprises at least eight nozzles.

13. The apparatus according to claim 1, wherein said spin chuck is adapted to hold a wafer-shaped article such that a downwardly-facing major surface of the wafer-shaped article is spaced from said at least one lower nozzle arm by a distance of 2 to 10 mm.

14. The apparatus according to claim 13, wherein said spin chuck is adapted to hold a wafer-shaped article such that a downwardly-facing major surface of the wafer-shaped article is spaced from said at least one lower nozzle arm by a distance of 3 to 7 mm.

15. The apparatus according to claim 13, wherein said spin chuck is adapted to hold a wafer-shaped article such that a downwardly-facing major surface of the wafer-shaped article is spaced from said at least one lower nozzle arm by a distance of about 5 mm.

\* \* \* \* \*